United States Patent
Teraji et al.

(10) Patent No.: US 9,947,808 B2
(45) Date of Patent: Apr. 17, 2018

(54) CIGS COMPOUND SOLAR CELL

(71) Applicant: NITTO DENKO CORPORATION, Ibaraki-shi, Osaka (JP)

(72) Inventors: Seiki Teraji, Ibaraki (JP); Kazunori Kawamura, Ibaraki (JP); Hiroto Nishii, Ibaraki (JP); Taichi Watanabe, Ibaraki (JP)

(73) Assignee: NITTO DENKO CORPORATION, Osaka (JP)

( * ) Notice: Subject to any disclaimer, the term of this patent is extended or adjusted under 35 U.S.C. 154(b) by 414 days.

(21) Appl. No.: 14/376,761

(22) PCT Filed: Feb. 25, 2013

(86) PCT No.: PCT/JP2013/054720
§ 371 (c)(1),
(2) Date: Aug. 5, 2014

(87) PCT Pub. No.: WO2013/129296
PCT Pub. Date: Sep. 6, 2013

(65) Prior Publication Data
US 2015/0027537 A1   Jan. 29, 2015

(30) Foreign Application Priority Data

Feb. 27, 2012 (JP) .................. 2012-040152
Dec. 26, 2012 (JP) .................. 2012-283071

(51) Int. Cl.
*H01L 31/00* (2006.01)
*H01L 31/0216* (2014.01)
(Continued)

(52) U.S. Cl.
CPC .............. *H01L 31/02167* (2013.01); *H01L 31/022466* (2013.01); *H01L 31/0322* (2013.01);
(Continued)

(58) Field of Classification Search
CPC ............. H01L 31/0322; H01L 31/0749; H01L 31/03923; H01L 31/02167;
(Continued)

(56) References Cited

U.S. PATENT DOCUMENTS 6,259,016 B1   7/2001   Negami et al.
2002/0043278 A1   4/2002   Hashimoto et al.
(Continued)

FOREIGN PATENT DOCUMENTS

EP   2 771 498   5/2013
JP   2000-323733 A   11/2000
(Continued)

OTHER PUBLICATIONS

Hariskos, D. et al., "Buffer layers in Cu(In,Ga)Se2 solar cells and modules", Thin Solid Films 480-481 (2005), 99-109.*
(Continued)

*Primary Examiner* — Tamir Ayad
(74) *Attorney, Agent, or Firm* — Westerman, Hattori, Daniels & Adrian, LLP

(57) ABSTRACT

In order to provide a CIGS compound solar cell with a high conversion efficiency, a CIGS compound solar cell including a rear electrode layer, a CIGS light absorbing layer, a buffer layer, and a transparent electrode layer in this order over a substrate is configured such that the buffer layer comprises a mixed crystal of a Group IIa metal and zinc oxide, and characteristics of the mixed crystal as shown by X-ray diffraction satisfy the following formula (1):

$$0.5 \leq A/(A+B+C) < 1 \qquad (1)$$

(where none of A, B, C are 0)
A: peak intensity at plane (002)
B: peak intensity at plane (100)
C: peak intensity at plane (101).

1 Claim, 2 Drawing Sheets

(51) Int. Cl.
- *H01L 31/032* (2006.01)
- *H01L 31/0749* (2012.01)
- *H01L 31/0224* (2006.01)
- *H01L 31/0328* (2006.01)
- *H01L 31/0392* (2006.01)

(52) U.S. Cl.
CPC .... *H01L 31/0328* (2013.01); *H01L 31/03923* (2013.01); *H01L 31/0749* (2013.01); *Y02E 10/541* (2013.01)

(58) Field of Classification Search
CPC ......... H01L 31/022466; H01L 31/0328; Y02E 10/541; Y02E 10/543
USPC ...................................................... 136/262
See application file for complete search history.

(56) References Cited

U.S. PATENT DOCUMENTS

| | | |
|---|---|---|
| 2005/0189012 A1 | 9/2005 | Kondo et al. |
| 2010/0170566 A1* | 7/2010 | Harmala ............ B29C 45/0053 136/256 |
| 2010/0206381 A1 | 8/2010 | Aida et al. |
| 2013/0048060 A1 | 2/2013 | Akiike et al. |
| 2014/0311564 A1 | 10/2014 | Maekawa et al. |

FOREIGN PATENT DOCUMENTS

| | | | |
|---|---|---|---|
| JP | 2002-124688 A | 4/2002 | |
| JP | 2002-343987 A | 11/2002 | |
| JP | 2004-363544 A | 12/2004 | |
| JP | 2006-269607 A | 10/2006 | |
| JP | 3837114 | * 10/2006 | ............ H01L 31/04 |
| JP | 2010-192689 A | 9/2010 | |
| JP | 2010-212614 A | 9/2010 | |
| JP | 2011-213301 A | 10/2011 | |
| JP | 2011-231401 A | 11/2011 | |
| JP | 2013-93484 A | 5/2013 | |
| WO | 2013/061134 A2 | 5/2013 | |

OTHER PUBLICATIONS

Minemoto, Takashi et al., "Preparation of $Zn_{1-x}Mg_xO$ films by radio frequency magnetron sputtering", Thin Solid Films 372 (2000) 173-176.*
Singh, Amanpal et al., "Anomalous behavior in ZnMgO thin films deposited by sol-gel method", Dec. 31, 2010, Thin Solid Films 519, pp. 5826-5830.*
English machine translation of JP3837114, Oct. 25, 2006.*
Extended European Search Report dated Sep. 29, 2015, issued in counterpart European Patent Application No. 13755506.6 (6 pages).
Notification of Transmittal of Translation of the International Preliminary Report on Patentability (Form PCT/IB/338) of International Application No. PCT/JP2013/054720 dated Sep. 12, 2014 with Forms PCT/IB/373 and PCT/ISA/237.
International Search Report dated May 28, 2013, issued in corresponding application No. PCT/JP2013/054720.
Office Action dated Jul. 5, 2016, issued in counterpart Japanese Patent Application No. 2012-283071, with English translation. (4 pages).
Office Action dated Feb. 7, 2017, issued in counterpart Japanese Patent Application No. 2012-283071, with English translation. (4 pages).

* cited by examiner

CIGS COMPOUND SOLAR CELL

TECHNICAL FIELD

The present invention relates to a CIGS compound solar cell.

BACKGROUND ART

Compound solar cells which use $CuInSe_2$ (CIS) composed of elements from Groups Ib, IIIb, and VIb or $Cu(In,Ga)Se_2$ (CIGS) compound semiconductors with Ga therein present as solid solutions (Group I-III-VI compound semiconductors) for light absorbing layers are known to be high in light conversion efficiency (hereinafter, referred to as "conversion efficiency"), able to be formed into thin films, and advantageous in that the conversion efficiency is less likely to be degraded due to light irradiation or the like.

For a buffer layer of a CIGS solar cell using such a CIS or CIGS (hereinafter, referred to as "CIGS") compound semiconductor for a light absorbing layer, CdS, Zn(O,S), or the like formed by a chemical deposition method is typically used (for example, see Patent Document 1). However, in the case of forming the buffer layer by the chemical deposition method, it is necessary to form a CIGS compound semiconductor layer by a vapor deposition or selenization method under vacuum, then once extract the layer under the atmosphere, form the buffer layer, and form a transparent electrode layer again under vacuum, and there is the problem of poor productivity.

Therefore, in order to solve this problem, it has been proposed that the buffer layer is formed continuously by a sputtering method under vacuum without the extraction under the atmosphere (for example, see Patent Document 2).

CITATION LIST

Patent Literature

PLT1: JP-A-2002-343987
PLT2: JP-A-2002-124688

SUMMARY OF INVENTION

However, when the buffer layer is formed continuously under vacuum with the use of a magnetron sputtering system widely used as a sputtering system, as in Patent Document 2, the conversion efficiency will not be expected to be improved, while the conversion efficiency is improved. For this reason, it is strongly desirable to increase the productivity and achieve a further high conversion efficiency.

In view of the problem mentioned above, an object of the present invention is to provide a CIGS compound solar cell including a buffer layer which can be formed under vacuum without any extraction under the atmosphere, moreover with a higher conversion efficiency than ever before.

In order to achieve the object mentioned above, the present invention consists in a CIGS compound solar cell including at least a Group I-III-VI compound semiconductor layer, a buffer layer, and a transparent electrode layer in this order over a substrate, where the buffer layer includes a mixed crystal of a Group IIa metal and zinc oxide, and characteristics of the mixed crystal as shown by X-ray diffraction satisfy the following formula (1).

$$0.5 \leq A/(A+B+C) < 1 \tag{1}$$

(where none of A, B, C are 0)
 A: peak intensity at plane (002)
 B: peak intensity at plane (100)
 C: peak intensity at plane (101)

The CIGS compound solar cell according to the present invention has, as a light-absorbing layer, the Group I-III-VI compound semiconductor which has a chalcopyrite structure, and the buffer layer of the cell comprises the mixed crystal of the Group IIa metal and Zn oxide. For this reason, an electric current with a high conversion efficiency is adapted to be produced at the boundary between the Group I-III-VI compound semiconductor and the buffer layer. In addition, the CIGS compound solar cell can achieve a higher conversion efficiency than ever before, because characteristics of the mixed crystal as shown by X-ray diffraction are adapted to satisfy the formula (1) mentioned above.

In addition, when characteristics of the mixed crystal as shown by X-ray diffraction satisfy the formula (2), the buffer layer becomes less likely to be cracked, and the loss of electric current can be reduced which is caused by making electrons less likely to flow toward the transparent electrode layer.

$$0 < B/(A+B+C) < 0.2 \tag{2}$$

(where none of A, B, C are 0)
 A: peak intensity at plane (002)
 B: peak intensity at plane (100)
 C: peak intensity at plane (101)

Furthermore, when characteristics of the mixed crystal as shown by X-ray diffraction satisfy the formula (3), the buffer layer becomes less likely to be cracked, and the loss of electric current can be further reduced which is caused by making electrons less likely to flow toward the transparent electrode layer.

$$0 < C/(A+B+C) < 0.3 \tag{3}$$

(where none of A, B, C are 0)
 A: peak intensity at plane (002)
 B: peak intensity at plane (100)
 C: peak intensity at plane (101)

Further, when characteristics of the mixed crystal as shown by X-ray diffraction satisfy the formula (4), the buffer layer becomes less likely to be cracked, the buffer layer can be further coupled with the interface of the CIGS layer without defects, and the loss of electric current can be much further reduced which is caused by making interfacial electrons less likely to flow toward the transparent electrode layer.

$$0.7 < (A+C)/(A+B+C) < 1 \tag{4}$$

(where none of A, B, C are 0)
 A: peak intensity at plane (002)
 B: peak intensity at plane (100)
 C: peak intensity at plane (101)

DESCRIPTION OF EMBODIMENTS

Next, an embodiment for carrying out the present invention will be described.

Figure 1:
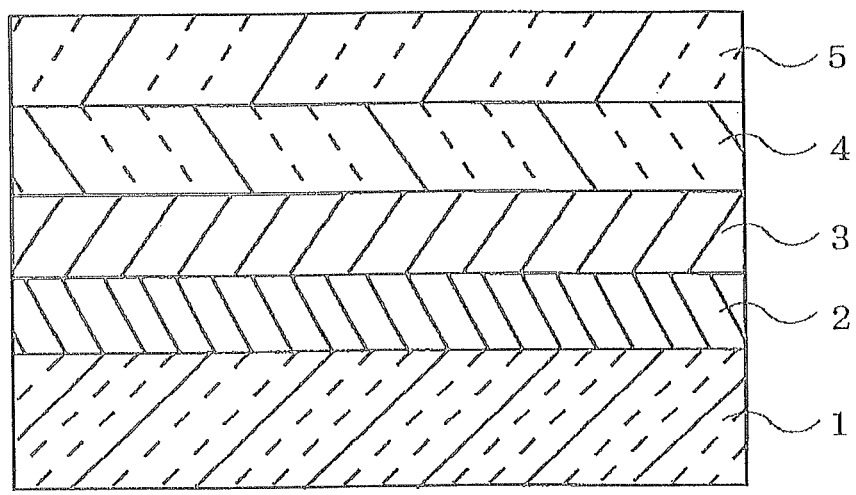
FIG. 1 is a cross-sectional view of a CIGS solar cell according to an embodiment of the present invention.

FIG. 1 is a cross-sectional view of a CIGS solar cell according to an embodiment of the present invention. This CIGS solar cell includes a substrate 1, a rear electrode layer 2, a CIGS light absorbing layer (compound semiconductor layer) 3, a buffer layer 4, and a transparent electrode layer 5 in this order. The buffer layer 4 comprises a mixed crystal of a Group IIa metal and zinc oxide, and characteristics of the mixed crystal as shown by X-ray diffraction are adapted to satisfy the following formula (1) (A, B, and C below hereinafter indicate the same numbers, respectively):

$$0.5 \leq A/(A+B+C) < 1 \qquad (1)$$

(where none of A, B, C are 0)
A: peak intensity at plane (002)
B: peak intensity at plane (100)
C: peak intensity at plane (101)

This CIGS solar cell will be described below in detail. It is to be noted that FIG. 1 is shown schematically in thickness, size, appearance, etc., which differs from the actual cell (the same applies to FIG. 2).

For the substrate 1, glass substrates, metal substrates, resin substrates, etc. can be used. The glass substrates include low alkali glass (high strain point glass) which has an extremely low content of alkali metal elements, alkali-free glass containing no alkali metal elements, and soda-lime glass. However, in the case of using the low alkali glass, alkali-free glass, metal substrates, and resin substrates, it is desirable to add a minute amount of Na during or after the formation of the CIGS light absorbing layer 3.

In addition, the flexible elongated shape of the substrate 1 is preferred because the CIGS compound solar cell can be manufactured by a roll-to-roll method or a stepping roll method. The "elongated shape" mentioned above refers to a shape that is 10 times or more as long in the length direction as in the width direction, and a shape that is 30 times or more as long in the length direction as in the width direction is more preferably used. Furthermore, the thickness of the substrate 1 preferably falls within the range of 5 to 200 μm, more preferably within the range of 10 to 100 μm. More specifically, this is because an excessively large thickness has the possibility of losing the flexibility of the CIGS compound solar cell, increasing the stress applied when the CIGS compound solar cell is bent, and damaging the laminated structure such as the CIGS light absorbing layer 3, whereas an excessively small thickness has a tendency to increase the defects rate of product of the CIGS compound solar cell due to the substrate 1 buckled in manufacturing the CIGS compound solar cell.

Next, the rear electrode layer 2 formed over the substrate 1 can be formed by a sputtering method, a vapor deposition method, an ink-jet method, or the like, and has a single layer or multiple layers formed from molybdenum (Mo), tungsten (W), chromium (Cr), titanium (Ti), and the like. In addition, the thickness (the total thickness of respective layers in the case of multiple layers) preferably falls within the range of 10 to 1000 μm. It is to be noted that there is no need to provide the rear electrode layer 2 when the substrate 1 has the function of the rear electrode layer 2 (has conductivity). In addition, thermal diffusion of impurities derived from the substrate 1 adversely affects the performance of the CIGS compound solar cell, and thus, for the purpose of preventing the thermal diffusion, a barrier layer (not shown) may be provided over the substrate 1 or the rear electrode layer 2. Such a barrier layer can be formed, for example, by a sputtering method, a vapor deposition method, a CVD method, a sol-gel method, a liquid-phase deposition method, or the like with the use of Cr or the like.

Furthermore, the CIGS light absorbing layer (compound semiconductor layer) 3 formed on the rear electrode layer 2 comprises a compound semiconductor containing four elements of copper (Cu), indium (In), gallium (Ga), and selenium (Se). Further, the thickness thereof preferably falls within the range of 1.0 to 3.0 μm, more preferably within the range of 1.5 to 2.5 μm. This is because an excessively small thickness has a tendency to reduce the amount of light absorption in the case of use as a light-absorbing layer, and degrade the performance of the solar cell, whereas an excessively large thickness has a tendency to increase the amount of time for the formation of the CIGS light absorbing layer 3, thereby resulting in poor productivity. Methods for forming this CIGS light absorbing layer 3 include a vapor deposition method, a selenization/sulfurization method, and a sputtering method.

In addition, the composition ratio of Cu to In and Ga in the CIGS light absorbing layer 3 preferably satisfies the formula of 0.7<Cu/(Ga+In)<0.95 (molar ratio). This is because, when this formula is satisfied, $Cu_{(2-x)}Se$ can be further prevented from being excessively incorporated into the CIGS light absorbing layer 3, and moreover, the entire layer can be made slightly deficient in Cu. In addition, the ratio between Ga and In that are elements belonging to the same group preferably falls within the range of 0.10<Ga/(Ga+In)<0.40 (molar ratio).

Further, the buffer layer 4 formed on the CIGS light absorbing layer 3 comprises a mixed crystal of a Group IIa metal and zinc oxide, and as described above, characteristics of this mixed crystal as shown by X-ray diffraction are adapted to satisfy the formula (1) mentioned above. This is the greatest feature of the present invention. The characteristics of the mixed crystal which satisfy the formula (1) mentioned above indicates that the peak intensity A is extremely high as compared with B and C, whereas the case of A/(A+B+C)=1 indicates the crystal has entirely the (002) orientation. More specifically, the satisfaction with the formula (1) indicates that a high proportion of the mixed crystal has (002) orientation, that is, C-axis orientation (orientation from the CIGS light absorbing layer 3 toward the transparent electrode layer 5). As a result, the conversion efficiency is assumed to be improved because an increased proportion of electrons generated in the CIGS light absorbing layer 3 reaches the transparent electrode layer without being recombined at grain boundaries, etc. It is to be noted that in the case of A/(A+B+C)<0.5, the conversion efficiency is significantly decreased to cause a failure to achieve the advantageous effect of the present invention. In addition, in the case of A/(A+B+C)=1, the buffer layer 4 is likely to be cracked, and there is a tendency to degrade cell characteristics of the CIGS solar cell and decrease the handling ability.

Furthermore, it is preferred that the characteristics of the mixed crystal satisfy not only the formula (1) but also the formulas (2) to (4) mentioned above, because it is possible to not only reduce the loss of the conversion efficiency, but also make the buffer layer 4 less likely to be cracked and maintain a high conversion efficiency even when a flexible substrate is used as the substrate 1. More specifically, the buffer layer 4 has not only (002) oriented crystals, but also certain (100) and (101) oriented crystals, thereby making cracks less likely to be caused to improve the conversion efficiency.

The buffer layer 4 is preferably a high-resistance n-type semiconductor so as to be able to form a pn junction with the CIGS light absorbing layer 3, which may be not only a single layer, but also multiple layers stacked. The use of, as the buffer layer 4, multiple layers stacked can make the pn junction with the CIGS light absorbing layer 3 more favorable. Materials for forming this buffer layer 4 include, in addition to the mixed crystal of Mg and ZnO, CdS, ZnMgO, ZnCaO, ZnMgCaO, ZnMgSrO, ZnSrO, ZnO, ZnS, $Zn(OH)_2$, $In_2O_3$, and $In_2S_3$, and mixed crystals thereof such as Zn(O, S, OH) and Zn(O, S). In addition, the thickness thereof preferably falls within the range of 50 to 200 nm.

The buffer layer 4 can be formed by, for example, applying a voltage to a pair of targets with a high-frequency RF power source or with a combination of a high-frequency RF power source and a direct-current (DC) power source in a facing target sputtering method. The facing target sputtering method refers to a method of carrying out sputtering by placing two cathode targets to be opposed, and applying a magnetic field perpendicular to the target surfaces from one target toward the other target, unlike common magnetron sputtering methods. In this facing target sputtering method, the substrate 1 is placed perpendicular to the target on a side surface of the target.

Figure 2:
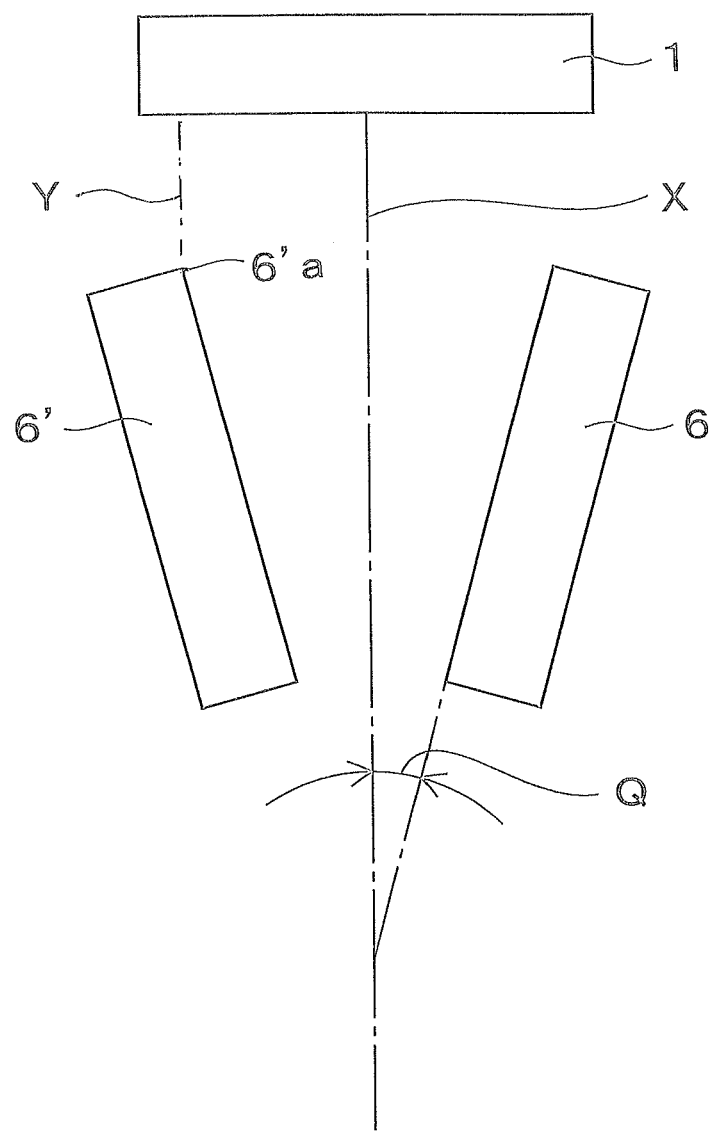
FIG. 2 is a diagram illustrating an arrangement of targets in a system for forming a buffer layer of the CIGS solar cell.

In addition, among facing target sputtering methods, it is preferred that two targets 6, 6' placed to be opposed on both sides of an assumed imaginary central axis X extending perpendicularly from the surface of the substrate 1, over which the CIGS light absorbing layer 3 is stacked, are used for the pair of targets as shown in FIG. 2, because the buffer layer 4 is more easily obtained which has characteristics as represented by the formula (1) mentioned above. In this case, the angle θ from at least one of the targets 6, 6' with respect to the imaginary central axis X is preferably set in the range of 5 to 15°, because the buffer layer 4 is further easily obtained which has characteristics as represented by the formula (1) mentioned above. It is to be noted the illustration of the rear electrode layer 2 and CIGS light absorbing layer 3 formed over the substrate 1 is omitted in FIG. 2.

Whether the obtained buffer layer 4 satisfies the formula (1) or not can be confirmed by, for example, measurement under the conditions of incident angle: 5° fixed and detector scan: 3°/min, with the use of a system from Bruker Corporation, XRD D8 DISCOVER with GADTS. It is to be noted that when the buffer layer 4 has multiple layers, at least a layer in contact with the CIGS light absorbing layer 3 only has to satisfy the formula (1). In addition, whether the buffer layer 4 satisfies the formulas (2) to (4) or not can be also confirmed by measurement under the same conditions as mentioned above.

Next, the transparent electrode layer 5 formed on the buffer layer 4 is preferably formed from a material that has a high transmission, and can be formed with the use of ITO, IZO, aluminum-containing zinc oxide (Al:ZnO), or the like. In addition, the thickness thereof preferably falls within the range of 50 to 300 nm. Further, the light transmission of the transparent electrode layer 5 preferably exceeds 80%. It is to be noted that this transparent electrode layer 5 can be formed by, for example, a sputtering method, a vapor deposition method, a metalorganic chemical vapor deposition (MOCVD) method, or the like.

In accordance with this configuration, the buffer layer 4 can be continuously obtained by sputtering, and moreover, the conversion efficiency is improved because the CIGS light absorbing layer 3 has a chalcopyrite structure. Therefore, the CIGS light absorbing layer 3 can be made to a thin film, and the entire CIGS solar cell can be configured in the form of a thin film. In addition, because the CIGS solar cell can be configured in the form of a thin film, light of wavelengths which are not used can be transmitted with a high probability, and the cell can be expanded in use application and can increase subjects on which the cell can be disposed. Furthermore, the buffer layer 4 comprises a mixed crystal of a Group IIa metal and zinc oxide, and as described above, characteristics of this mixed crystal as shown by X-ray diffraction are adapted to satisfy the formula (1) mentioned above. Thus, the conversion efficiency is further improved. Furthermore, when the characteristics of the buffer layer 4 as shown by X-ray diffraction are adapted to satisfy the formulas (2) to (4), the buffer layer 4 is less likely to be cracked, and excellent in handling ability, even when a flexible substrate is used as the substrate 1.

EXAMPLES

Next, examples will be described in conjunction with comparative examples. However, the present invention is not to be considered limited to the following examples.

Example 1

(Formation of Rear Electrode Layer)

First, over a surface of a substrate composed of degreased soda-lime glass (0.55 mm in thickness, 20 mm in size), a rear electrode layer comprising Mo of 0.8 mm in thickness was formed at a sputtering rate of 60 m/min by using a magnetron sputtering system (from ULVAC, Inc., Model Number SH-450) with the use of argon for a discharge gas and with the use of a direct-current (DC) power source for providing a sputtering pressure of 1 Pa.

(Formation of CIGS Light Absorbing Layer)

Next, a CIGS light absorbing layer was formed on the rear electrode layer formed above. More specifically, while Ga, In, Cu, and Se were each placed as vapor deposition sources in a chamber of a vacuum deposition system, the substrate was heated up to 550° C. at a rate of temperature increase of 550° C./h, with the degree of vacuum adjusted to $1 \times 10^{-4}$ Pa in the chamber. In this case, the CIGS light absorbing layer was formed on the rear electrode layer, in such a way that the vapor deposition sources were respectively heated so as to reach Ga (950° C.), In (780° C.), Cu (1100° C.), and Se (140° C.), for simultaneously evaporating these elements. The obtained CIGS light absorbing layer was Cu/Group III=0.89 and Ga/Group III=0.31 in composition (at. %), and 2.1 μm in film thickness.

(Formation of Buffer Layer)

Subsequently, a buffer layer was formed on the CIGS light absorbing layer formed above. The buffer layer was formed with the use of a facing target sputtering with the pair of targets 6, 6' shown in FIG. 2 arranged in a substantially V-shaped form (10° for each of the angles θ from the targets 6, 6' with respect to the center line). In this case, a target of composition: $Zn_{0.85}Mg_{0.15}O$ was used for a sputtering target, an edge 6'a of the target 6' was placed in a position 160 mm away from the surface of the substrate 1, and the temperature of the substrate 1 was set at 25° C. The composition analysis of the targets 6, 6' showed a mixture of about 3 at. % of Ca in Mg. Argon was used for the discharge gas during the sputtering, and the electric power and formation time were adjusted with a high-frequency (RF) power source, so as to achieve a power density of 0.7 W/cm$^2$ and a film thickness of 70 nm at a sputtering pressure of 0.3 Pa. It is to be noted that the edge 6'a of the target 6' refers to a part at the shortest distance from the substrate 1.

(Formation of Transparent Electrode Layer)

Furthermore, a transparent electrode layer was formed on the buffer layer formed above. The transparent electrode layer was formed with the use of a magnetron sputtering system (from ULVAC, Inc., Model Number SH-450). In this case, a target of composition: ITO ($In_2O_3$: 90 [at. %], $SnO_2$: 10 [at. %]) was used for the sputtering target. While an argon gas and an $O_2$ with 1/10 of the argon gas flow rate gas were used in combination for the discharge gas during the sputtering, and an ITO film (transparent electrode layer) of 200 nm in thickness was formed at a power density of 1.6 W/cm², a sputtering pressure of 0.3 Pa, and a sputtering rate of 20 nm/min with a high-frequency (RF) power source, thereby providing a CIGS solar cell according to Example 1. Characteristics of the buffer layer according to Example 1 as shown by X-ray diffraction represented A/(A+B+C)=0.6.

Example 2

Except for the condition for the formation of the buffer layer at a power density of 6.0 W/cm² with a high-frequency RF power source, a CIGS solar cell according to Example 2 was obtained in the same way as in Example 1. Characteristics of the buffer layer according to Example 2 as shown by X-ray diffraction represented A/(A+B+C)=0.8.

Example 3

Except for the condition for the formation of the buffer layer with a direct-current (DC) power source (power density: 6.0 W/cm²) and a high-frequency RF power source (power density: 6.0 W/cm²) in combination, a CIGS solar cell according to Example 3 was obtained in the same way as in Example 1. Characteristics of the buffer layer according to Example 3 as shown by X-ray diffraction represented A/(A+B+C)=0.7.

Example 4

Except that the buffer layer was formed under the condition for the formation of the buffer layer with a direct-current (DC) power source (power density: 2.5 W/cm²) and a high-frequency RF power source (power density: 0.5 W/cm²) in combination, a sputtering pressure of 0.1 Pa, the edge 6'a of the target 6' placed in a position 40 mm away from the surface of the substrate 1 (Y=40 mm), and the temperature of the substrate 1 set at 200° C., a CIGS solar cell according to Example 4 was obtained in the same way as in Example 1. Characteristics of the buffer layer according to Example 4 as shown by X-ray diffraction represented A/(A+B+C)=0.6.

Example 5

Except for the condition for the formation of the buffer layer with a direct-current (DC) power source (power density: 2.5 W/cm²) and a high-frequency RF power source (power density: 1.5 W/cm²) in combination, a sputtering pressure of 0.1 Pa, the edge 6'a of the target 6' placed in a position 160 mm away from the surface of the substrate 1 (Y=160 mm), and the temperature of the substrate 1 set at 200° C., a CIGS solar cell according to Example 5 was obtained in the same way as in Example 1. Characteristics of the buffer layer according to Example 5 as shown by X-ray diffraction represented A/(A+B+C)=0.7.

Comparative Example 1

Except that the buffer layer was formed with a common magnetron sputtering system (from ULVAC, Inc., Model Number SH-450), a CIGS solar cell according to Comparative Example 1 was obtained in the same way as in Example 1. It is to be noted that a direct-current (DC) power source (power density: 0.5 W/cm²) was used for magnetron sputtering. Characteristics of the buffer layer according to Comparative Example 1 as shown by X-ray diffraction represented A/(A+B+C)=0.2.

Comparative Example 2

Except for the condition for the formation of the buffer layer with a direct-current (DC) power source (power density: 1.5 W/cm²), a CIGS solar cell according to Comparative Example 2 was obtained in the same way as in Comparative Example 1. Characteristics of the buffer layer according to Comparative Example 2 as shown by X-ray diffraction represented A/(A+B+C)=0.1.

Comparative Example 3

Except for the condition for the formation of the buffer layer with a high-frequency (RF) power source (power density: 0.5 W/cm²), a CIGS solar cell according to Comparative Example 3 was obtained in the same way as in Comparative Example 1. Characteristics of the buffer layer according to Comparative Example 3 as shown by X-ray diffraction represented A/(A+B+C)=0.3.

Comparative Example 4

Except for the condition for the formation of the buffer layer with a high-frequency RF power source (power density: 2.5 W/cm²), a CIGS solar cell according to Comparative Example 4 was obtained in the same way as in Comparative Example 1. Characteristics of the buffer layer according to Comparative Example 4 as shown by X-ray diffraction represented A/(A+B+C)=0.2.

Comparative Example 5

Except that a direct-current (DC) power source (power density: 0.7 W/cm²) was used for the facing target sputtering system for use in the formation of the buffer layer, a CIGS solar cell according to Comparative Example 5 was obtained in the same way as in Example 1. Characteristics of the buffer layer according to Comparative Example 5 as shown by X-ray diffraction represented A/(A+B+C)=0.2.

<Measurement of Conversion Efficiency>

For each of the CIGS solar cells according to Examples 1 to 5 and Comparative Examples 1 to 5 described above, 20 pieces were prepared, and irradiated with quasi-sunlight (AM 1.5) to measure the conversion efficiency for each piece with the use of an IV measurement system (from Yamashita Denso Corporation, YSS-150). The obtained results (averages) are shown in [Table 1] below.

TABLE 1

| | Characteristics of Buffer Layer as Shown by X-ray Diffraction | | | | Conversion Efficiency (%) |
|---|---|---|---|---|---|
| | A/(A + B + C) | B/(A + B + C) | C/(A + B + C) | (A + C)/(A + B + C) | |
| Example 1 | 0.6 | 0.1 | 0.2 | 0.9 | 4.2 |
| Example 2 | 0.8 | 0.1 | 0.1 | 0.9 | 4.5 |
| Example 3 | 0.7 | 0.1 | 0.2 | 0.9 | 4.2 |
| Example 4 | 0.6 | 0.3 | 0.1 | 0.7 | 3.3 |

TABLE 1-continued

| | Characteristics of Buffer Layer as Shown by X-ray Diffraction | | | | Conversion |
| --- | --- | --- | --- | --- | --- |
| | A/(A + B + C) | B/(A + B + C) | C/(A + B + C) | (A + C)/(A + B + C) | Efficiency (%) |
| Example 5 | 0.7 | 0.1 | 0.3 | 0.9 | 3.5 |
| Comparative Example 1 | 0.2 | 0.4 | 0.4 | 0.6 | 0.7 |
| Comparative Example 2 | 0.1 | 0.6 | 0.3 | 0.4 | 0.4 |
| Comparative Example 3 | 0.3 | 0.3 | 0.3 | 0.7 | 2.7 |
| Comparative Example 4 | 0.2 | 0.4 | 0.4 | 0.6 | 2.1 |
| Comparative Example 5 | 0.2 | 0.4 | 0.4 | 0.6 | 0.9 |

The results of measuring the conversion efficiency as described above have shown that the CIGS solar cells according to Examples 1 to 5 each have an excellent conversion efficiency with an average conversion efficiency of 3.3% or higher. Above all, the CIGS solar cells according to Examples 1 to 3 where characteristics of the buffer layers as shown by X-ray diffraction satisfy all of the formulas (1) to (4) have been shown to each have a superexcellent conversion efficiency with an average conversion efficiency in excess of 4%. On the other hand, the CIGS solar cell according to Comparative Examples 1 to 5 where characteristics of the buffer layers as shown by X-ray diffraction fail to satisfy the formula (1) have been shown to be each low in average conversion efficiency.

While specific embodiments in the present invention have been given in the examples described above, the examples by way of example only are not to be considered construed in a limited way. Various modifications that are obvious to one skilled in the art are intended within the scope of the present invention.

The CIGS compound solar cell according to the present invention can be used in various fields, because the conversion efficiency is extremely high in spite of the thinness.

DESCRIPTION OF REFERENCE SIGNS

1 substrate
2 rear electrode layer
3 CIGS light absorbing layer
4 buffer layer
5 transparent electrode layer

What is claimed is:
1. A CIGS compound solar cell comprising:
at least a Group compound semiconductor layer,
a buffer layer, and
a transparent electrode in this order over a substrate,
wherein the buffer layer comprises a mixed crystal of a Group IIa metal and zinc oxide, and
wherein characteristics of the mixed crystal as shown by X-ray diffraction satisfy the following formulas:

$$0.5 \leq A/(A+B+C) < 1;$$

$$0 < B/(A+B+C) \leq 0.3;$$

$$0 < C/(A+B+C) \leq 0.3;$$

$$0.7 \leq (A+C)/(A+B+C) < 1;$$

where none of A, B, C are 0; and
A: peak intensity at plane (002),
B: peak intensity at plane (100),
C: peak intensity at plane (101).

* * * * *

UNITED STATES PATENT AND TRADEMARK OFFICE
CERTIFICATE OF CORRECTION

PATENT NO. : 9,947,808 B2
APPLICATION NO. : 14/376761
DATED : April 17, 2018
INVENTOR(S) : Teraji et al.

Page 1 of 1

It is certified that error appears in the above-identified patent and that said Letters Patent is hereby corrected as shown below:

In the Claims

Column 10, Line 18:
Change:
at least a "Group compound semiconductor layer,"
To be:
at least a --Group I-III-VI compound semiconductor layer,--

Signed and Sealed this
Third Day of July, 2018

Andrei Iancu
*Director of the United States Patent and Trademark Office*